(12) United States Patent
Nakayashiki et al.

(10) Patent No.: US 7,999,175 B2
(45) Date of Patent: Aug. 16, 2011

(54) INTERDIGITATED BACK CONTACT SILICON SOLAR CELLS WITH LASER ABLATED GROOVES

(75) Inventors: Kenta Nakayashiki, Sandvika (NO); Baomin Xu, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 385 days.

(21) Appl. No.: 12/207,446

(22) Filed: Sep. 9, 2008

(65) Prior Publication Data

US 2010/0059109 A1 Mar. 11, 2010

(51) Int. Cl.
*H02N 6/00* (2006.01)
*H01L 31/00* (2006.01)

(52) U.S. Cl. .................... 136/255; 136/243; 136/244

(58) Field of Classification Search .................. None
See application file for complete search history.

(56) References Cited

U.S. PATENT DOCUMENTS

| | | | |
|---|---|---|---|
| 2,031,387 A | 2/1936 | Schwarz | |
| 2,789,731 A | 4/1957 | Marraffino | |
| 3,032,008 A | 5/1962 | Land et al. | |
| 3,159,313 A | 12/1964 | Guilford | |
| 3,602,193 A | 8/1971 | Adams et al. | |
| 3,973,994 A | 8/1976 | Redfield | |
| 3,988,166 A | 10/1976 | Beam | |
| 4,018,367 A | 4/1977 | Morine et al. | |
| 4,021,267 A | 5/1977 | Dettling | |
| 4,045,246 A | 8/1977 | Mlavsky et al. | |
| 4,053,327 A | 10/1977 | Meulenberg, Jr. | |
| 4,084,985 A | 4/1978 | Evans, Jr. | |
| 4,086,485 A | 4/1978 | Kaplow et al. | |
| 4,095,997 A | 6/1978 | Griffiths | |
| 4,104,091 A | 8/1978 | Evans, Jr. et al. | |
| 4,119,058 A | 10/1978 | Schmermund | |

(Continued)

FOREIGN PATENT DOCUMENTS

CN 1346517 A 4/2002

(Continued)

OTHER PUBLICATIONS

Szlufcik et al. "Low-Cost Industrial Technologies of Crystalline Silicon Solar Cells", Proc. of the IEEE, vol. 85, No. 5, May 1, 1997, pp. 711-730.

(Continued)

*Primary Examiner* — Alexa D Neckel
*Assistant Examiner* — Shannon Gardner
(74) *Attorney, Agent, or Firm* — Bever, Hoffman & Harms, LLP; Patrick T. Bever

(57) ABSTRACT

Interdigitated back contact (IBC) solar cells are produced by depositing spaced-apart parallel pads of a first dopant bearing material (e.g., boron) on a substrate, heating the substrate to both diffuse the first dopant into corresponding first (e.g., p+) diffusion regions and to form diffusion barriers (e.g., borosilicate glass) over the first diffusion regions, and then disposing the substrate in an atmosphere containing a second dopant (e.g., phosphorus) such that the second dopant diffuses through exposed surface areas of the substrate to form second (e.g., n+) diffusion regions between the first (p+) diffusion regions (the diffusion barriers prevent the second dopant from diffusion into the first (p+) diffusion regions). The substrate material along each interface between adjacent first (p+) and second (n+) diffusion regions is then removed (e.g., using laser ablation) such that elongated grooves, which extend deeper into the substrate than the diffused dopant, are formed between adjacent diffusion regions.

9 Claims, 6 Drawing Sheets

U.S. PATENT DOCUMENTS

| | | |
|---|---|---|
| 4,131,485 A | 12/1978 | Meinel et al. |
| 4,141,231 A | 2/1979 | Kudlich |
| 4,148,301 A | 4/1979 | Cluff |
| 4,153,476 A | 5/1979 | Shelpuk |
| 4,177,083 A | 12/1979 | Kennedy |
| 4,205,216 A | 5/1980 | Douglas |
| 4,221,468 A | 9/1980 | Macken |
| 4,223,202 A | 9/1980 | Peters et al. |
| 4,224,081 A | 9/1980 | Kawamura et al. |
| 4,254,894 A | 3/1981 | Fetters |
| 4,330,680 A * | 5/1982 | Goetzberger ............... 136/247 |
| 4,331,703 A | 5/1982 | Lindmayer |
| 4,337,758 A | 7/1982 | Meinel et al. |
| 4,355,196 A | 10/1982 | Chai |
| 4,461,403 A | 7/1984 | Prahs |
| 4,476,165 A | 10/1984 | McIntyre |
| 4,479,027 A | 10/1984 | Todorof |
| 4,490,418 A | 12/1984 | Yoshida |
| 4,521,457 A | 6/1985 | Russell et al. |
| 4,533,814 A | 8/1985 | Ward |
| 4,540,843 A | 9/1985 | Gochermann et al. |
| 4,589,191 A | 5/1986 | Green et al. |
| 4,602,120 A | 7/1986 | Wakefield et al. |
| 4,609,037 A | 9/1986 | Wheeler et al. |
| 4,683,348 A | 7/1987 | Pidgeon et al. |
| 4,746,370 A | 5/1988 | Woolf |
| 4,747,517 A | 5/1988 | Hart |
| 4,792,685 A | 12/1988 | Yamakawa |
| 4,796,038 A | 1/1989 | Allen et al. |
| 4,826,777 A | 5/1989 | Ondris |
| 4,841,946 A | 6/1989 | Marks |
| 4,847,349 A | 7/1989 | Ohta et al. |
| 4,849,028 A | 7/1989 | Krause |
| 4,855,884 A | 8/1989 | Richardson |
| 4,896,015 A | 1/1990 | Taboada et al. |
| 4,933,623 A | 6/1990 | Fox |
| 4,938,994 A | 7/1990 | Choinski |
| 4,947,825 A | 8/1990 | Moriarty |
| 4,952,026 A | 8/1990 | Bellman et al. |
| 4,996,405 A | 2/1991 | Poumey et al. |
| 5,000,988 A | 3/1991 | Inoue et al. |
| 5,004,319 A | 4/1991 | Smither |
| 5,011,565 A | 4/1991 | Dube et al. |
| 5,062,899 A | 11/1991 | Kruer |
| 5,075,281 A | 12/1991 | Testardi |
| 5,089,055 A | 2/1992 | Nakamura |
| 5,151,377 A | 9/1992 | Hanoka et al. |
| 5,167,724 A | 12/1992 | Chiang |
| 5,180,441 A | 1/1993 | Cornwall et al. |
| 5,213,628 A | 5/1993 | Noguchi et al. |
| 5,216,543 A | 6/1993 | Calhoun |
| 5,254,388 A | 10/1993 | Melby et al. |
| 5,344,496 A | 9/1994 | Stern et al. |
| 5,353,813 A | 10/1994 | Deevi et al. |
| 5,356,488 A | 10/1994 | Hezel |
| 5,389,159 A | 2/1995 | Kataoka et al. |
| 5,449,413 A | 9/1995 | Beauchamp et al. |
| 5,501,743 A | 3/1996 | Cherney |
| 5,529,054 A | 6/1996 | Shoen |
| 5,536,313 A | 7/1996 | Watanabe et al. |
| 5,538,563 A | 7/1996 | Finkl |
| 5,540,216 A | 7/1996 | Rasmusson |
| 5,543,333 A | 8/1996 | Holdermann |
| 5,552,820 A | 9/1996 | Genovese |
| 5,559,677 A | 9/1996 | Errichiello |
| 5,560,518 A | 10/1996 | Catterall et al. |
| 5,569,399 A | 10/1996 | Penney et al. |
| 5,590,818 A | 1/1997 | Raba et al. |
| 5,665,175 A | 9/1997 | Safir |
| 5,700,325 A | 12/1997 | Watanabe |
| 5,733,608 A | 3/1998 | Kessel et al. |
| 5,751,436 A | 5/1998 | Kwon et al. |
| 5,873,495 A | 2/1999 | Saint-Germain |
| 5,916,461 A | 6/1999 | Costin et al. |
| 5,918,771 A | 7/1999 | van der Heijden |
| 5,929,530 A | 7/1999 | Stone |
| 5,949,123 A | 9/1999 | Le et al. |
| 5,981,902 A | 11/1999 | Arita et al. |
| 5,990,413 A | 11/1999 | Ortabasi |
| 6,011,307 A | 1/2000 | Jiang et al. |
| 6,020,554 A | 2/2000 | Kaminar et al. |
| 6,032,997 A | 3/2000 | Elliott et al. |
| 6,047,862 A | 4/2000 | Davies |
| 6,091,017 A | 7/2000 | Stern |
| 6,118,067 A | 9/2000 | Lashley et al. |
| 6,130,465 A | 10/2000 | Cole |
| 6,140,570 A | 10/2000 | Kariya |
| 6,164,633 A | 12/2000 | Mulligan et al. |
| 6,180,869 B1 * | 1/2001 | Meier et al. ............... 136/256 |
| 6,183,186 B1 | 2/2001 | Howells et al. |
| 6,203,621 B1 | 3/2001 | Tran et al. |
| 6,232,217 B1 | 5/2001 | Ang et al. |
| 6,257,450 B1 | 7/2001 | Jackson et al. |
| 6,274,508 B1 | 8/2001 | Jacobsen et al. |
| 6,278,054 B1 | 8/2001 | Ho et al. |
| 6,293,498 B1 | 9/2001 | Stanko et al. |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,379,521 B1 | 4/2002 | Nishio |
| 6,398,370 B1 | 6/2002 | Chiu et al. |
| 6,407,329 B1 | 6/2002 | Iino et al. |
| 6,410,843 B1 | 6/2002 | Kishi et al. |
| 6,413,113 B2 | 7/2002 | Uher et al. |
| 6,418,986 B1 | 7/2002 | Gabriele |
| 6,420,266 B1 | 7/2002 | Smith et al. |
| 6,423,140 B1 | 7/2002 | Liu et al. |
| 6,429,037 B1 | 8/2002 | Wenham et al. |
| 6,459,418 B1 | 10/2002 | Comiskey et al. |
| 6,479,395 B1 | 11/2002 | Smith et al. |
| 6,527,964 B1 | 3/2003 | Smith et al. |
| 6,531,653 B1 | 3/2003 | Glenn et al. |
| 6,555,739 B2 | 4/2003 | Kawam |
| 6,568,863 B2 | 5/2003 | Murata |
| 6,590,235 B2 | 7/2003 | Carey et al. |
| 6,597,510 B2 | 7/2003 | Bunkenburg et al. |
| 6,623,579 B1 | 9/2003 | Smith et al. |
| 6,663,944 B2 | 12/2003 | Park et al. |
| 6,666,165 B2 | 12/2003 | Shiraishi et al. |
| 6,667,434 B2 | 12/2003 | Morizane et al. |
| 6,743,478 B1 | 6/2004 | Kiiha et al. |
| 6,890,167 B1 | 5/2005 | Kwok et al. |
| 6,896,381 B2 | 5/2005 | Benitez et al. |
| 6,924,493 B1 | 8/2005 | Leung |
| 6,979,798 B2 | 12/2005 | Gu et al. |
| 7,002,675 B2 | 2/2006 | MacGibbon et al. |
| 7,045,794 B1 | 5/2006 | Spallas et al. |
| 7,101,592 B2 | 9/2006 | Gueggi et al. |
| 7,129,592 B1 | 10/2006 | Yetter |
| 7,152,985 B2 | 12/2006 | Benitez et al. |
| 7,160,522 B2 | 1/2007 | Minano Dominguez et al. |
| 7,181,378 B2 | 2/2007 | Benitez et al. |
| 7,388,147 B2 | 6/2008 | Mulligan et al. |
| 7,394,016 B2 | 7/2008 | Gronet |
| 2001/0008230 A1 | 7/2001 | Keicher et al. |
| 2002/0056473 A1 | 5/2002 | Chandra et al. |
| 2002/0060208 A1 | 5/2002 | Liu et al. |
| 2002/0127953 A1 | 9/2002 | Doan et al. |
| 2002/0148497 A1 | 10/2002 | Sasaoka et al. |
| 2002/0149107 A1 | 10/2002 | Chang et al. |
| 2002/0154396 A1 | 10/2002 | Overbeck |
| 2003/0015820 A1 | 1/2003 | Yamazaki et al. |
| 2003/0095175 A1 | 5/2003 | Agorio |
| 2003/0129810 A1 | 7/2003 | Barth et al. |
| 2003/0201581 A1 | 10/2003 | Weber et al. |
| 2003/0213429 A1 | 11/2003 | Kreuzer |
| 2003/0232174 A1 | 12/2003 | Chang et al. |
| 2004/0012676 A1 | 1/2004 | Weiner |
| 2004/0031517 A1 | 2/2004 | Bareis |
| 2004/0048001 A1 | 3/2004 | Kiguchi et al. |
| 2004/0070855 A1 | 4/2004 | Benitez et al. |
| 2004/0084077 A1 | 5/2004 | Aylaian |
| 2004/0151014 A1 | 8/2004 | Speakman |
| 2004/0191422 A1 | 9/2004 | Kataoka |
| 2004/0200520 A1 * | 10/2004 | Mulligan et al. ............ 136/256 |

| | | | |
|---|---|---|---|
| 2004/0211460 | A1 | 10/2004 | Simburger et al. |
| 2005/0000566 | A1 | 1/2005 | Posthuma et al. |
| 2005/0029236 | A1 | 2/2005 | Gambino et al. |
| 2005/0034751 | A1 | 2/2005 | Gross et al. |
| 2005/0046977 | A1 | 3/2005 | Shifman |
| 2005/0067729 | A1 | 3/2005 | Laver et al. |
| 2005/0081908 | A1 | 4/2005 | Stewart |
| 2005/0133084 | A1 | 6/2005 | Joge et al. |
| 2005/0194037 | A1 | 9/2005 | Asai |
| 2005/0221613 | A1 | 10/2005 | Ozaki et al. |
| 2005/0253308 | A1 | 11/2005 | Sherwood |
| 2006/0046269 | A1 | 3/2006 | Thompson et al. |
| 2006/0076105 | A1 | 4/2006 | Furui et al. |
| 2006/0207650 | A1 | 9/2006 | Winston et al. |
| 2006/0231133 | A1 | 10/2006 | Fork et al. |
| 2006/0251796 | A1 | 11/2006 | Fellingham |
| 2006/0266235 | A1 | 11/2006 | Sandhu et al. |
| 2008/0047605 | A1 | 2/2008 | Benitez et al. |
| 2008/0138456 | A1 | 6/2008 | Fork et al. |

FOREIGN PATENT DOCUMENTS

| | | |
|---|---|---|
| CN | 2606309 Y | 3/2004 |
| CN | 1854637 A | 11/2006 |
| DE | 197 35 281 A1 | 2/1999 |
| EP | 0 257 157 A | 3/1988 |
| EP | 0 851 511 A | 7/1998 |
| EP | 1 145 797 A | 10/2001 |
| EP | 1 351 318 A | 10/2003 |
| EP | 1 715 260 A | 10/2006 |
| EP | 1 763 086 A | 3/2007 |
| EP | 1 787 786 A | 5/2007 |
| EP | 1 833 099 A | 9/2007 |
| JP | 60082680 A | 5/1985 |
| JP | 02055689 A | 2/1990 |
| JP | 02 187291 A | 7/1990 |
| JP | 2002-111035 A | 4/2002 |
| JP | 2004-266023 A | 9/2004 |
| JP | 2005051216 | 2/2005 |
| WO | WO 91/08503 A | 6/1991 |
| WO | WO 91/15355 | 10/1991 |
| WO | WO 92/15845 A | 9/1992 |
| WO | WO 94/28361 A1 | 12/1994 |
| WO | WO 97/21253 A | 6/1997 |
| WO | WO 97/48519 A | 12/1997 |
| WO | WO 00/49421 A | 8/2000 |
| WO | WO 00/49658 A1 | 8/2000 |
| WO | WO 00/50215 | 8/2000 |
| WO | WO 02/052250 A | 7/2002 |
| WO | WO 02/097724 A1 | 12/2002 |
| WO | WO 03/047005 A | 6/2003 |
| WO | WO 03/076701 A | 9/2003 |
| WO | WO 2005/070224 A1 | 8/2005 |
| WO | WO 2005/107957 A1 | 11/2005 |
| WO | WO 2005/107958 A1 | 11/2005 |
| WO | WO 2006/097303 A | 9/2006 |
| WO | WO 2007/104028 | 9/2007 |

OTHER PUBLICATIONS

Ruthe et al. "Etching of $CuInSe_2$ Thin Films-Comparison of Femtosecond and Picosecond Laser Ablation", Applied Surface Science, vol. 247, No. 1-4, Jul. 15, 2005, pp. 447-452.
Sparber et al. "Comparison of texturing methods for monocrystalline silicon solar cells using KOH and $Na_2CO_3$," 3$^{rd}$ World Conf. Photovoltaic Energy Conversion, Osaka, 2003, pp. 1372-1375.
MacDonald et al. "Texturing industrial multicrystalline silicon solar cells," Solar Energy, vol. 76, 2004, pp. 277-283.
Tool et al. "Straightforward in-line processing for 16.8% efficient mc-Si solar cells," 31$^{st}$ IEEE Photovoltaic Specialists Conf., Florida, 2005, pp. 1324-1327.
Fukui et al. "17.7% efficiency large area multicrystalline silicon solar cell using screen-printed metallization technique," 31$^{st}$ IEEE Photovoltaic Specialists Conf., Florida, 2005, pp. 979-982.
Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.

Zhao et al. "19.8% efficient 'honeycomb' textured multicrystalline and 24.4% monocrystalline silicon solar cells," Applied Physics Letters, vol. 73, pp. 1991-1993, 1998.
Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.
Murphy, Jr. "Home photovoltaic systems for physicists," *Physics Today*, Jul. 2008, pp. 42-47.
Brogren et al. "Optical properties, durability, and system aspects of a new aluminum-polymer-laminated steel reflector for solar concentrators", Jan. 2004, Solar Energy Materials and Solar Cells, 82, pp. 387-412.
Mauk et al. "Buried Metal/Dielectric/Semiconductor Reflectors for Light Trapping in Epitaxial Thin-Film Solar Cells", May 1996, IEEE, 25th PVSC, pp. 147-150.
Munzer et al. "Thin Monocrystalline Silicon Solar Cells", Oct. 1999, IEEE Transactions on Electron Devices, vol. 46, No. 10, pp. 2055-2061.
U.S. Appl. No. 11/282,882, filed Nov. 17, 2005, Fork et al.
U.S. Appl. No. 11/282,829, filed Nov. 17, 2005, Fork et al.
U.S. Appl. No. 11/336,714, filed Jan. 20, 2006, Fork et al.
Alvarez et al. "RXI Concentrator for 1000X Photovoltaic Energy Conversion".
Benitez et al. "High-Concentration Mirror-Based Kohler Integrating System for Tandem Solar Cells", WCPEC2006, 4 pages.
Bett et al. "FLATCON™ and FLASHCON™ Concepts for High Concentration PV", Presented at the 19$^{th}$ European Photovoltaic Solar Energy Conf., Jun. 7-11, 2004, Paris, 4 pages.
Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.
Cuevas et al. "50 Per Cent More Output Power from an Albedo-Collecting Flat Panel Using Bifacial Solar Cells", *Solar Energy*, vol. 29, No. 5, pp. 419-420, 1982.
Finlayson et al. "$Bi_2 O_3$-$Wo_3$ compounds for photocatalytic applications by solid state and viscous processing", Title from a conference scheduled for Oct. 6-7, 2004 in Munich, 8 pages.
Gordon et al. "Optical performance at the thermodynamic limit with tailored imaging designs", Applied Optics, in press, Dec. 2004, 16 pages.
Kenis et al. "Fabrication inside Microchannels Using Fluid Flow", Accounts of Chemical Research, vol. 33, No. 12, 2000, pp. 841-847.
Kerschaver et al. "Back-contact Solar Cells: A Review," Progress in Photovoltaics: Research and Applications, 2006, vol. 14, pp. 107-123.
Kränzl et al. "Bifacial Solar Cells on Multi-Crystalline Silicon", 15$^{th}$ International Photovoltaic Science & Engineering Conference, Shanghai, China, 2 pages, 2005.
Mueller et al. "Breathable Polymer Films Produced by the Microlayer Coextrusion Process", Journal of Applied Polymer Science, vol. 78, pp. 816-828, 2000.
Mulligan et al. "A Flat-Plate Concentrator: Micro-Concentrator Design Overview", 2000 IEEE, pp. 1495-1497.
Mulligan et al. "Development of Chip-Size Silicon Solar Cells," IEEE Photovoltaic Specialists Conference, 2000, pp. 158-163.
Neuhaus et al. "Industrial Silicon Wafer Solar Cells," Advances in OptoElectronics, vol. 2007, 2007, 15 pages.
Nguyen, Luu "Wafer Level Packaging for Analog/Mixed Signal Applications", MEPTEC Int. Wafer Level Packaging Conference, Aug. 22, 2002, 41 pages.
Rao et al. "Microfabricated Deposition Nozzles for Direct-Write Assembly of Three-Dimensional Periodic Structures", *Advanced Materials*, vol. 17, No. 3, Feb. 10, 2005, 5 pages.
Recart et al. "Large Area Thin BSF Solar Cells With Simultaneously Diffused Boron and Phosphorus Screen Printed Emitters", IEEE, pp. 1213-1216, 2005.
Sun et al. "Modeling and Experimental Evaluation of Passive Heat Sinks for Miniature High-Flux Photovoltaic Concentrators", Transactions of the ASME, vol. 127, pp. 138-145 (2005).

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Swanson, Richard M. "The Promise of Concentrators", *Prog. Photovolt. Res. Appl.* 8, pp. 93-111 (2000).

Taguchi et al. An Approach for the Higher Efficiency in the HIT Cells, IEEE, pp. 866-871, 2005.

Terao et al. "A Mirror-Less Design for Micro-Concentrator Modules", Conference Record of the 28$^{th}$ IEEE Photovoltaic Specialists Conference (2000) pp. 1416-1419.

Terao, Akira "MicroDish: A Novel Reflective Optic For Flat-Plate Micro-Concentrator", SPIE's 49$^{th}$ Annual Meeting, Aug. 2-6, 2004, Denver, Colorado, USA, 9 pages.

Van Hoy et al. "Microfabrication of Ceramics by Co-extrusion", *J. Am. Ceram. Soc.*, vol. 81, No. 1, pp. 152-158, 1998.

Weber et al. "Modelling of Sliver® Modules Incorporating a Lambertian Rear Reflector", The Australian National University, Canberra ACT 0200, Australia, 4 pages, 2005.

Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

Extrusion/Coextrusion Dies, Extrusion Dies Industries, LLC, http://www.extrusiondies.com/PRODUCTS/ExtrusionDies/multimanifoldDies.html, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

SunPower Corp. News Release, May 12, 2008, Available URL: http://investors.sunpowercorp.com/releasedetail.cfm?ReleaseID=309613.

Knight et al. "Hydrodynamic Focusing on a Silicon Chip: Mixing Nanoliters in Microseconds", Physical Review Letters, vol. 80, No. 17, Apr. 27, 1998, pp. 3863-3866.

Raabe et al. "High Aspect Ratio Screen Printed Fingers", 20th European Solar Energy Conference and Exhibition, Barcelona, Spain, Jun. 6-10, 2005, 4 pgs.

"Annual Review of Numerical Fluid Mechanics and Heat Transfer", vol. 1, Ed. T. C. Chawla, "Chapter Five, Buckling Flows: A New Frontier in Fluid Mechanics", A. Bejan, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

\* cited by examiner

INTERDIGITATED BACK CONTACT SILICON SOLAR CELLS WITH LASER ABLATED GROOVES

FIELD OF THE INVENTION

This invention relates to the conversion of light irradiation to electrical energy using photovoltaic devices (solar cells), more particularly, to methods and tools for producing interdigitated back contact (IBC) solar cells, and to the IBC solar cells produced by these methods.

BACKGROUND OF THE INVENTION

Solar cells are typically photovoltaic devices that convert sunlight directly into electricity. Solar cells typically include a semiconductor (e.g., silicon) wafer (substrate) that absorbs light irradiation (e.g., sunlight) in a way that creates free electrons, which in turn are caused to flow in the presence of a built-in field to create direct current (DC) power. The DC power generated by several solar cells may be collected on a grid placed on the cell. Solar cells are typically made using square or quasi-square silicon wafers that are doped to include one or more n-type doped regions, and one or more p-type doped regions. Such solar cells (also known as silicon wafer-based solar cells) are currently the dominant technology in the commercial production of solar cells, and are the main focus of the present invention.

A desirable solar cell geometry, commonly referred to as the interdigitated back contact (IBC) cell, consists of a semiconductor wafer, such as silicon, and alternating lines (interdigitated stripes) of p-type and n-type doping. This cell architecture has the advantage that all of the electrical contacts to the p and n regions can be made to one side of the wafer. When the wafers are connected together into a module, the wiring is all done from one side. Device structure and fabrication means for this device have been described previously in co-owned and U.S. patent application Ser. No. 11/336,714 entitled "Solar Cell Production Using Non-Contact Patterning and Direct-Write Metallization", which is incorporated herein by reference in its entirety. On May 12, 2008, SunPower Corp. (San Jose, Calif., USA) announced achieving 23.4% efficiency in a prototype IBC cell (see http://investors.sunpowercorp.com/releasedetail.cfm?ReleaseID=309613).

A problem with IBC solar cells is that the conventional fabrication process used to produce IBC cells is quite complicated and, hence, more expensive as compared to the fabrication processes require to produce conventional 'H-pattern' solar cells. According to D. H. Neuhaus and A. Munzer, "Industrial Silicon Wafer Solar Cells" (Advances in Optoelectronics, vol. 2007, pp. 1-15, 2007), IBC cells require seventeen process steps (minimum) in order to complete the cell fabrication process, whereas conventional H-pattern solar cells require only nine steps.

What is needed is a method for producing IBC-type solar cells that overcomes the deficiencies of conventional production methods by reducing the manufacturing costs and complexity, whereby IBC-type solar cells can be produced at substantially the same or lower cost as conventional H-pattern solar cells.

SUMMARY OF THE INVENTION

The present invention is directed to a method for fabricating IBC solar cells that includes combining phosphorus and boron diffusion processes in which a screen-printable or spin-on-dopant boron source is deposited on the rear surface of a crystalline silicon substrate, and then phosphorus dopant is diffused such that the boron source acts as a diffusion barrier for phosphorus diffusion to prevent a cross doping of p+ and n+ diffusion regions. After the diffusion process, p+ and n+ diffusion regions are separated by laser ablation, forming grooves in the rear surface between the adjacent p+ and n+ diffusion regions. The resulting fabrication process reduces the number of processing steps by approximately half (in comparison to conventional methods), and facilitates producing IBC solar cells at approximately the same (or lower) cost as currently required to produce 'H-pattern' solar cells.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in photovoltaic devices (e.g., solar cells) that can be used, for example, to convert solar power into electrical energy. The following description is presented to enable one of ordinary skill in the art to make and use the invention as provided in the context of a particular application and its requirements. As used herein, directional terms such as "upper", "lower", "side", "front", "rear", and "vertical" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
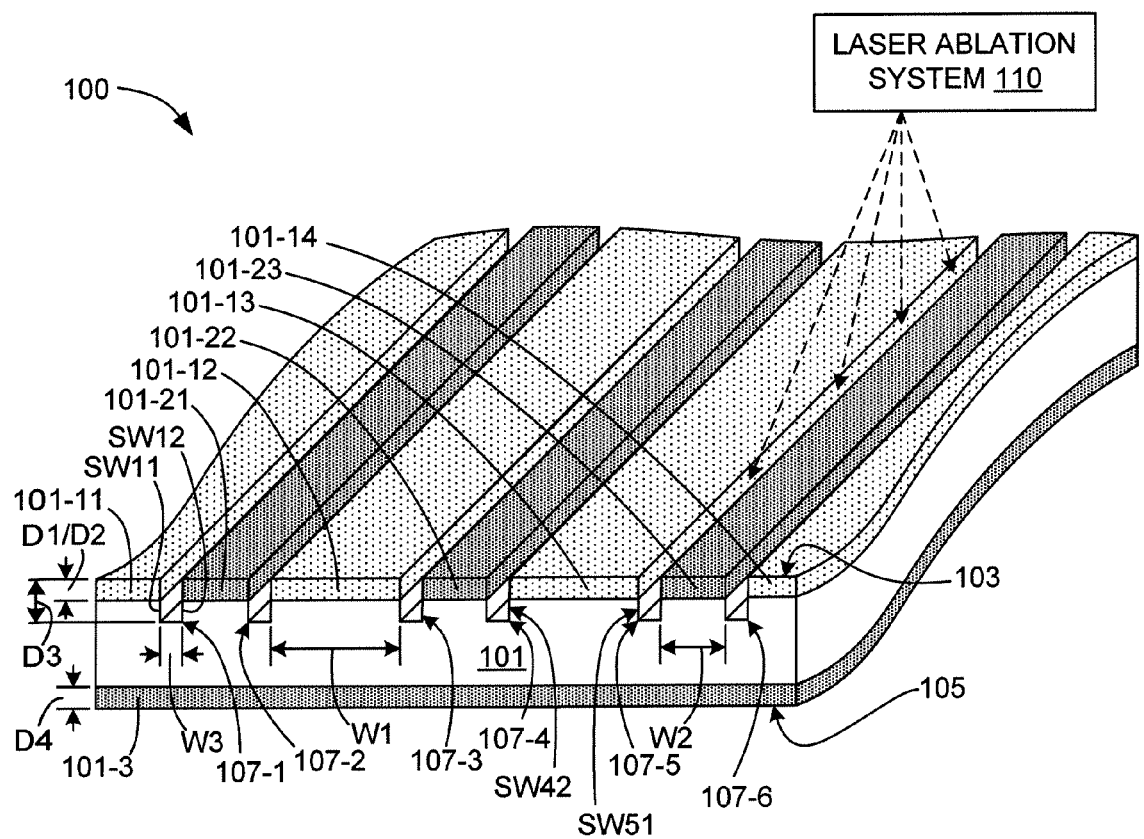
FIG. 1 is a perspective view showing a partially fabricated IBC solar cell according to an embodiment of the present invention.
Figure 2:
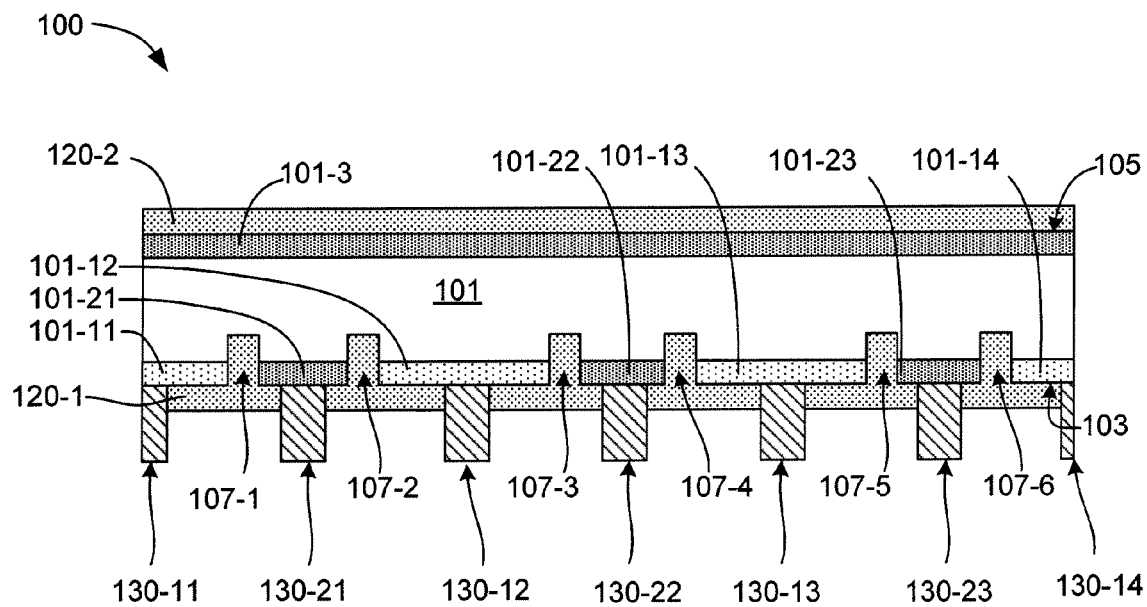
FIG. 2 is a cross-sectional side view showing the IBC solar cell of FIG. 1 in a substantially completed state.

FIG. 1 is a partial perspective view and FIG. 2 is a cross-sectional side view showing a simplified IBC solar cell 100 according to an embodiment of the present invention. Those skilled in the art will recognize that FIGS. 1 and 2 are simplified to show only a few diffusion lines and utilizes a distorted scale in order to highlight key features of the invention.

Referring to FIG. 1, IBC solar cell 100 is formed on a semiconductor silicon (Si) wafer (substrate) 101 having a rear surface 103 and an opposing front surface 105. Substrate 101 includes several diffusion regions that are indicated in FIG. 1 by shading, and unshaded portions of substrate 101 represent standard semiconductor Si. In one embodiment, the semiconductor Si is an n-type monocrystalline wafer with the resistivity between 0.1 and 2000Ω·cm, but other type Si materials, such as p-type monocrystalline Si wafer, and n-type or p-type multicrystalline Si wafers, can also be used. Similar to conventional IBC solar cells, IBC solar cell 100 includes multiple interdigitated (parallel, spaced-apart) diffusion regions 101-11 to 101-14 and 101-21 to 101-23 that are formed through rear surface 103, and a continuous blanket (fourth) diffusion region 101-3 that is formed through front surface 105. A first set of diffusion regions 101-11 to 101-14 include a p-type dopant (e.g., boron) having a sheet resistance between 20 and 200 Ω/square, and a second set of diffusion regions 101-21 to 101-23 include a n-type dopant (e.g., phosphorus) having a sheet resistance between 20 and 200 Ω/square. The p-type dopant is diffused into substrate 101 such that diffusion regions 101-11 to 101-14 have a nominal depth D1 between 0.1 and 5 µm, measured from rear surface 103 as indicated in FIG. 1, and has a width W1 in the range of 100 to 3000 µm. The n-type dopant is diffused into substrate 101 such that diffusion regions 101-21 to 101-23 have a nominal depth D2 of 0.1 to 5 µm, measured from rear surface 103 as indicated in FIG. 1, and has a width W2 in the range of 10 to 500 µm. The diffusion regions are arranged such that each of the second set of diffusion regions 101-21 to 101-23 is disposed between a corresponding pair of diffusion regions of the first set. For example, a (third) n+ diffusion region 101-22 is disposed between a (first) p+ diffusion region 101-12 and a (second) n+ diffusion region 101-13.

According to an aspect of the present invention, a series of grooves 107-1 to 107-6 that are defined into rear surface 103 between adjacent pairs of the diffusion regions. Grooves 107-1 to 107-6 represent elongated voids or openings in rear surface 103 where substrate material is removed from between adjacent diffusion regions. For example, p+ diffusion region 101-12 is separated from n+ diffusion region 101-22 by (third) groove 107-3, and p+ diffusion region 101-13 is separated from n+ diffusion region 101-22 by a groove 107-4. Each groove 107-1 to 107-6 has a (third) depth D3 (e.g., preferably in the range of 0.2 to 10 µm, and more preferably in the range of 0.5 to 1.5 µm) extending into substrate 101 from rear surface 103 that is greater than depths D1 and D2, whereby each adjacent pair of diffusion regions are physically separated from each other by a corresponding groove (e.g., diffusion regions 101-12 and 101-22 are separated by groove 107-3).

In accordance with another aspect of the present invention, grooves 107-1 to 107-6 are formed such that each diffusion region extends continuously between corresponding (vertical) side walls of two adjacent associated grooves. That is, each groove has a width W3 (i.e., preferably in the range of 1 to 50 µm, and more preferably in the range of 1 to 10 µm) defined by a distance between opposing vertical side walls (e.g., groove 107-1 has a width W3 measured between side walls SW11 and SW12). Each diffusion region extends between associated side walls of adjacent grooves. For example, diffusion region 101-12 extends between side wall SW42 of groove 107-4 and side wall SW51 of groove 107-5. As set forth below, grooves 107-1 to 107-6 are formed such that the entire region between side walls SW42 and SW51 to the depth D1 has the p-type dopant (e.g., boron) that forms diffusion region 101-13.

IBC solar cell 100 is shown in a substantially completed state in FIG. 2, wherein a surface passivation layer 120-1 (e.g., one of $SiN_x$, $SiC_x$, $SiO_2$, $SiO_2/SiN_x$, or any other suitable dielectric materials) is formed over rear surface 103, and an anti-reflection layer 120-2 (e.g., $SiN_x$, $TiO_2$, or any other suitable dielectric materials) is formed over front surface 105, whereby diffusion regions 101-11 to 101-14, 101-21 to 101-23 and 101-3 are protected by the respective layers. In accordance with another aspect of the invention, grooves 107-1 to 107-6 are formed such that portions of passivation layer 120-1 are respectively disposed in each groove. Metal contacts 130-11 to 130-14 (e.g., AgAl) extend through passivation layer 120-1 and are respectively connected to p+ diffusion regions 101-11 and 101-14, and metal contacts 130-21 to 130-23 (e.g., Ag) extend through passivation layer 120-1 and are respectively connected to n+ diffusion regions 101-21 and 101-23.

Figure 3:
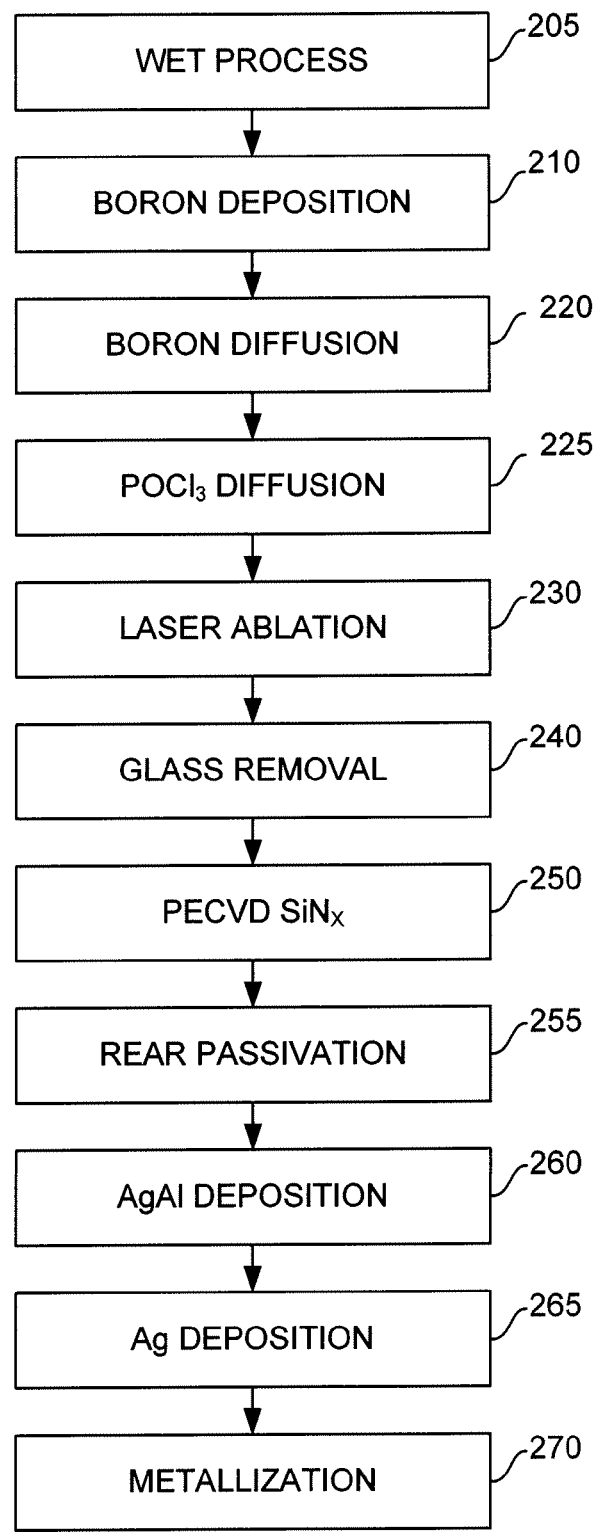
FIG. 3 is a flow diagram depicting a method for fabricating IBC solar cells according to another embodiment of the present invention.

FIG. 3 is a flow diagram depicting a method for fabricating IBC solar cells according to another embodiment of the present invention. FIGS. 4(A) to 4(K) are simplified cross-sectional side views depicting the process of FIG. 3.

Figure 4A:
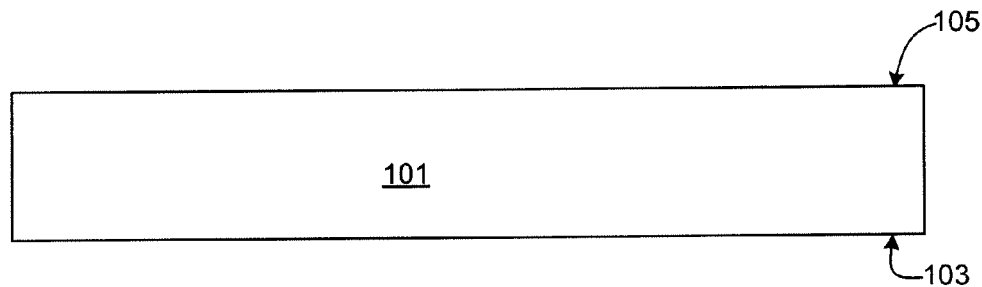
FIGS. 4(A), 4(B), 4(C), 4(D), 4(E), 4(F), 4(G), 4(H), 4(I), 4(J) and 4(K) are cross-sectional side views showing an IBC solar cell during various stages of the fabrication process of FIG. 3.

Referring to the top of FIG. 3 (block 205) and to FIG. 4(A), silicon wafer 101 is wet processed to facilitate surface texturing and cleaning on rear surface 103 and front surface 105.

Figure 4B:
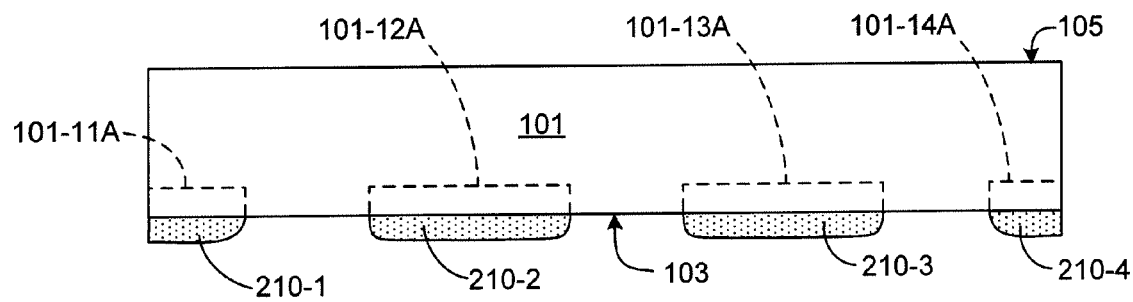

Next, referring to block 210 of FIG. 3 and to FIG. 4(B), a p-type dopant source (e.g., a printable Boron paste) is then deposited on rear surface 103 in strips having a width in the range of 100 to 3000 µm, and more preferably in the range of 1000 to 1200 µm, and with a spacing in the range of 10 to 500 µm, and more preferably in the range of 200 to 300 µm. In one embodiment, the deposition of the p-type dopant source includes an extrusion process such as that described in co-owned U.S. Patent Application No. 20080138456, entitled "Solar Cell Fabrication Using Extruded Dopant-Bearing Materials", which is incorporated herein by reference in its entirety. In another embodiment, the deposition of the p-type dopant source includes a well known printing process, such as screen printing, pad printing, or jet printing. As indicated in FIG. 4(B), the resulting dopant material pads 210-1 to 210-4 are disposed over regions 101-11A to 101-14A, respectively, which at this point in time are substantially undoped. A drying process is then performed to dry the dopant material before diffusion.

Figure 4C:
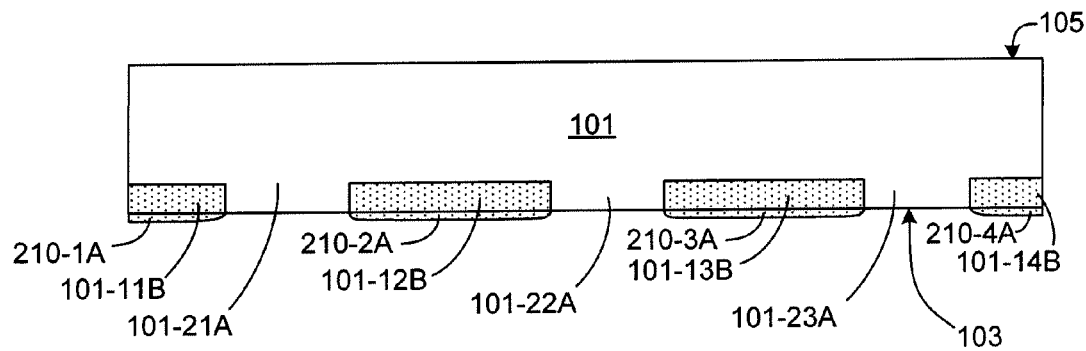

Referring to block 220 of FIG. 3 and to FIG. 4(C), diffusion of the boron into substrate 101 is then performed by placing substrate 101 into a preheated $POCl_3$ furnace with the $POCl_3$ source turned off, the furnace temperature to 900-950° C. to promote boron diffusion through rear surface 103, thereby forming diffusion regions 101-11B to 101-14B. In addition, in accordance with another aspect of the invention, the temperature during the boron diffusion process is selected such that the boron source material forms borosilicate glass layers 210-1A to 210-4A on rear surface 104 over diffusion regions 101-11B to 101-14B. Note that, after the boron diffusion process, diffusion regions 101-11B to 101-14B are separated by substantially undoped regions 101-21A to 101-23A.

Figure 4D:
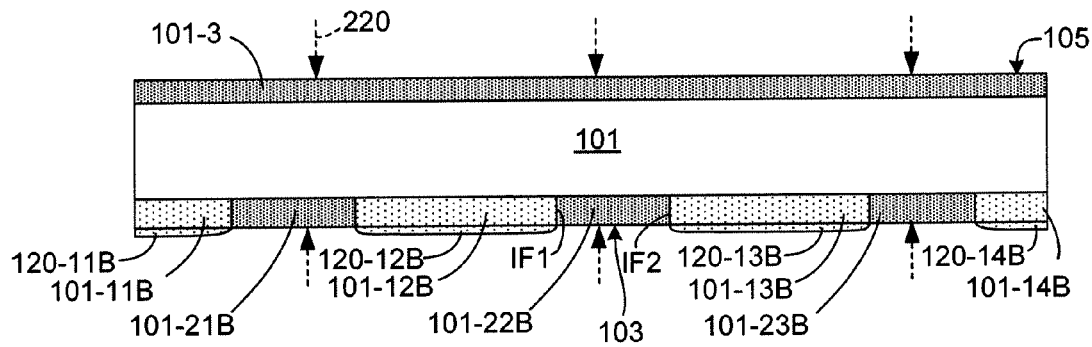

Referring to block 225 of FIG. 3 and to FIG. 4(D), diffusion of phosphorus (n-type dopant) into substrate 101 is then performed by cooling the $POCl_3$ furnace from the boron diffusion temperature (i.e., 900-950° C.) to a temperature in the range of 850-900° C. and then turning on the $POCl_3$ at a rate sufficient to achieve the phosphorus doping profile described herein. As indicated in FIG. 4(D), phosphorus (indicated by dashed line arrows) enters substrate 101 through front surface 105 and through exposed portions of rear surface 103, thereby forming n-type diffusion regions 101-21B to 101-23B and 101-3. In accordance with an aspect of the present invention, borosilicate glass layers 210-1A to 210-4A serve as diffusion barriers during the phosphorus diffusion process to prevent diffusion of phosphorus into diffusion regions 101-11B to 101-14B. The inventors believe that by lowering the furnace temperature below 900° C., the borosilicate glass formed during boron diffusion can effectively serve as a barrier for phosphor diffusion. Note that, at the end of the phosphorus diffusion process shown in FIG. 4(D), each adjacent diffusion region abuts its adjacent diffusion region (e.g., diffusion region 101-12B abuts diffusion region 101-22B at interface IF1, and diffusion region 101-22B abuts diffusion region 101-13B at interface IF2).

Figure 4E:
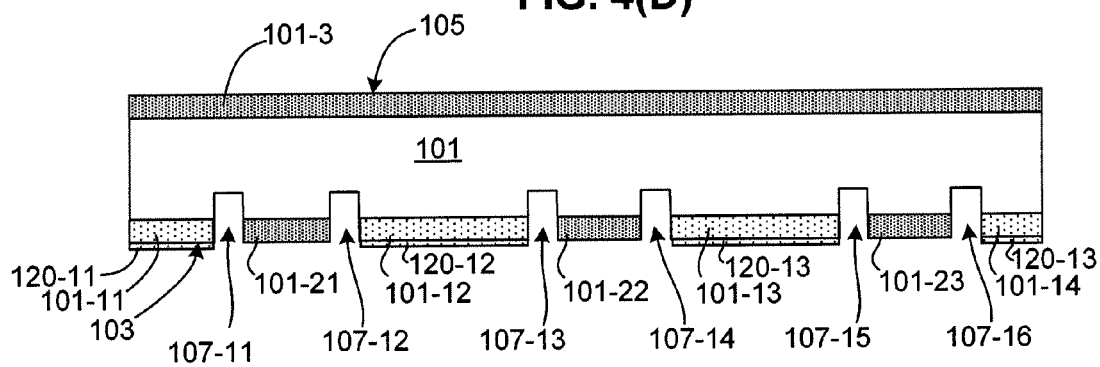

Referring to block 230 of FIG. 3 and to FIG. 4(E), grooves 107-11 to 107-16 are then formed in rear surface 103 at each interface between adjacent diffusion regions, whereby each groove separates adjacent p+ and n+ diffusion region pairs. In accordance with an aspect of the present invention, the groove formation process is performed by laser ablation using such as a Q-switched solid state laser with a pulse energy in a range such as from about 10 μl to about 300 μl whereby grooves are formed having a depth of approximately in the range of 0.5 μm to 5 μm and a width in the range of 5 to 50 μm.

Figure 4F:
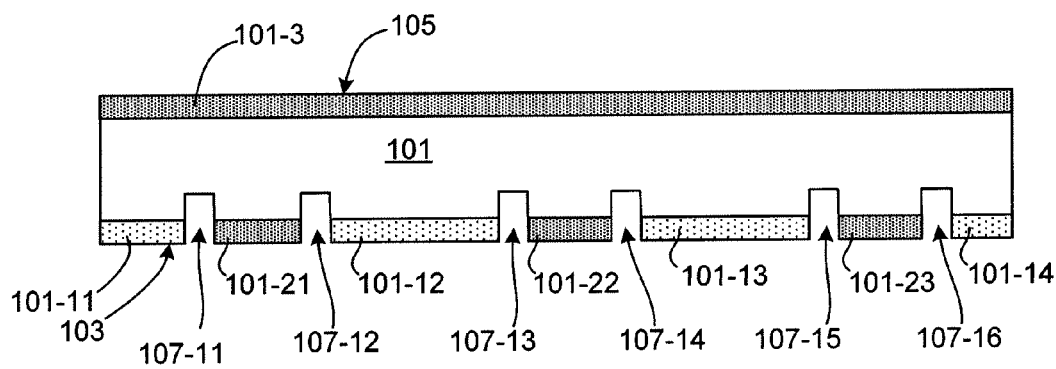

Referring to block 240 of FIG. 3 and to FIG. 4(F), glass removal is then performed to remove remaining borosilicate glass pads 120-11 to 120-14 (shown in FIG. 4(E).

In one embodiment, glass removal is performed using a wet chemical solution according to known techniques such as acid wet etching.

Figure 4G:
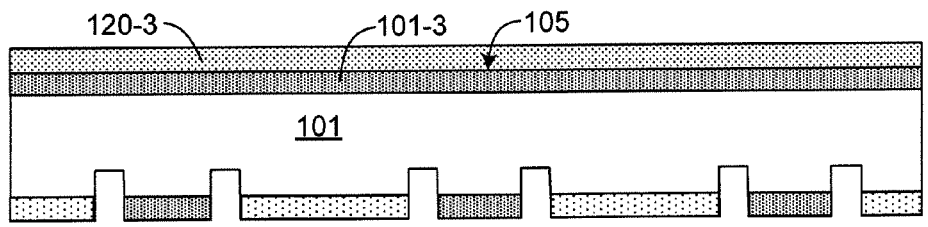
Figure 4H:
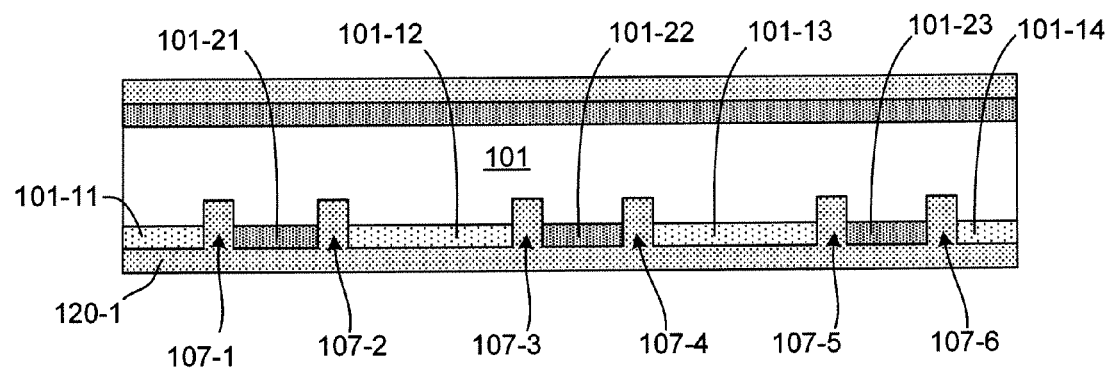

As shown in FIG. 3 (blocks 250 and 255) and in FIGS. 4(G) and 4(H), a SiNx anti-reflection layer 120-3 is then deposited in a PECVD reactor on front surface 105 over diffusion region 101-3, and then a surface passivation layer (e.g., SiNx, SiCx, SiO2/SiNx) is deposited on rear surface 103 according to known techniques such as PECVD or sputtering.

Figure 4I:
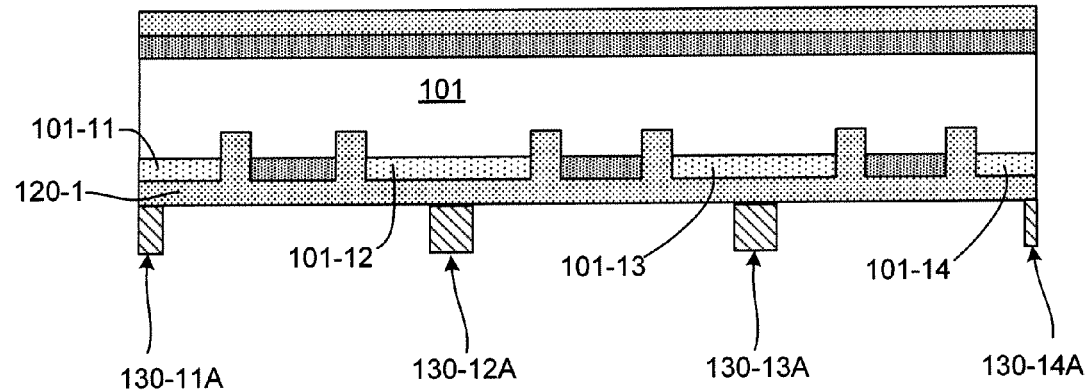
Figure 4J:
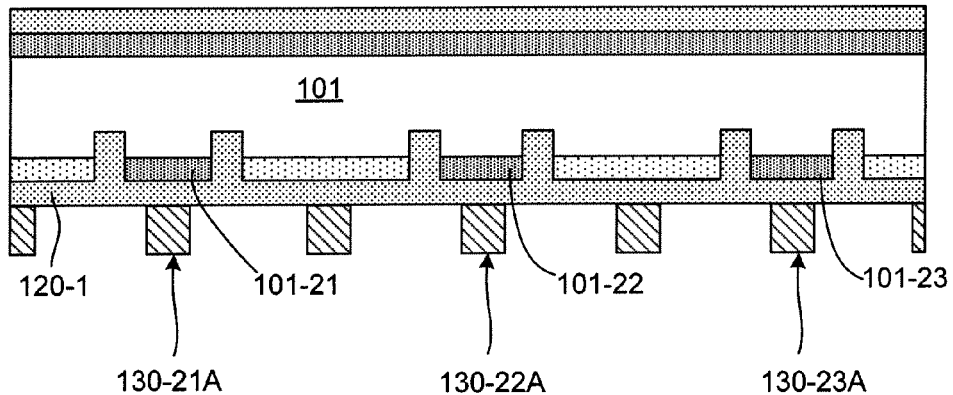
Figure 4K:
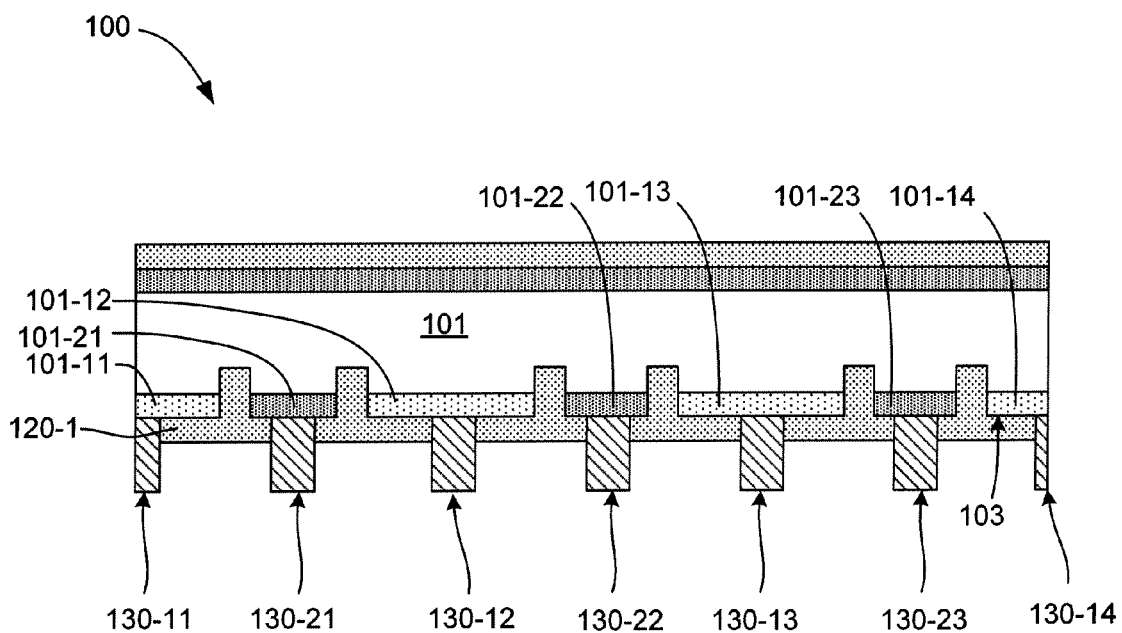

Referring to the lower portion of FIG. 3 and to FIGS. 4(I) and 4(J), AgAl paste portions 130-11A to 130-14A are respectively disposed on passivation layer 120-1 over p+ diffusion regions 101-11 to 101-14 (block 260 and FIG. 4(I)), and Ag paste portions 130-21A to 130-23A are respectively disposed on passivation layer 120-1 over n+ diffusion regions 101-21 to 101-23 (block 265 and FIG. 4(J)). In an alternative embodiment, Ag paste is deposited on both p+ diffusion regions 101-11 to 101-14 and n+ diffusion regions 101-21 to 101-23 simultaneously using, for example, screen printing or extrusion, thereby eliminating one process step and reducing the entire fabrication process to ten steps. Subsequent to the paste deposition (see block 270 of FIG. 3 and FIG. 4(K)), substrate 101 is heated in a belt furnace to induce metallization, whereby metal contacts 130-11 to 130-14 are formed through passivation layer 120-1 to p+ diffusion regions 101-11 to 101-14, and metal contacts 130-21 to 130-23 are formed through passivation layer 120-1 to n+ diffusion regions 101-21 to 101-23.

An advantage of the present invention is that IBC solar cell 100 (FIG. 1) can be fabricated with only ten process steps, which is seven steps less than conventional IBC cell fabrication processes (i.e., as described in D. H. Neuhaus and A. Munzer, "Industrial Silicon Wafer Solar Cells" (Advances in Optoelectronics, vol. 2007, pp. 1-15, 2007)), and only one step more than the fabrication process typically used to produce conventional 'H-pattern' solar cells. In additions, because the present invention enables the formation of IBC cells, the cost of module assembly, which accounts for 30-35% of the total solar cell module cost, is reduced by up to 30% over conventional "H-pattern" cell assembly, indicating that a 9.0-10.5% reduction in total module cost is possible, according to E. V. Kerschaver and G. Beaucarne, "Back-contact Solar Cells: Review," Progress in Photovoltaics: Research and Applications, vol. 14, pp. 107-123, 2006. Moreover, as the bow of wafers, which is usually caused by depositing Al paste and forming Al BSF (back surface field) on the entire rear surface in conventional "H-pattern" cells, can be greatly reduced or even eliminated for IBC cells, it is much easier to use thin Si wafers to produce IBC solar cells, which will also reduce the cost of Si materials. With these cost reductions both on module assembly and Si materials, the present invention (which just has minor process cost increase comparing to conventional "H-pattern" cells) reduces the final cost by up to about 20%, comparing to conventional cells even without efficiency improvement. Further, cost reduction to 30% are potentially realized because, in general, IBC cells have higher efficiency than the conventional "H-pattern" cells. The cost/efficiency analysis is provided in Table 1 (below).

TABLE 1

Cost and Efficiency Analysis

|  | Base | No process | High η | More η | PARC I | PARC II |
|---|---|---|---|---|---|---|
| Si | 100 | 100 | 100 | 100 | 75 | 75 |
| Process | 100 | 0 | 100 | 100 | 120 | 120 |
| Module | 100 | 100 | 100 | 100 | 70 | 70 |
| Eff. (%) | 17.0 | 17.0 | 20.0 | 24.3 | 17.0 | 19.4 |
| Power (W) | 4.14 | 4.14 | 4.87 | 5.91 | 4.14 | 4.73 |
| $/W | 2.50 | 2.13 | 2.12 | 1.75 | 2.00 | 1.75 |
| Cost reduction | NA | 15% | 15% | 30% | 20% | 30% |

As indicated in the leftmost column of Table 1, the baseline process is provided with costs of Si material, process, and module. Each cost accounts for 50%, 15%, and 35% of total module cost. The baseline process has 100% of Si material cost, 100% of processing cost, and 100% of module assembly cost, which result in total manufacturing cost of $2.50/W. Also, the cell/module efficiency is assumed to be 17%. The next cost analysis (second column from left) investigates the manufacturing cost without any processing. Therefore, the processing cost is 0%. Assuming that the module is able to produce an efficiency of 17%, the manufacturing cost is $2.13/W, which represents 15% reduction in cost. The primary target of the present invention is to achieve 30% cost reduction, so the "no process" option is not enough. The next cost analysis analyzes the impact of high-efficiency module, 20%. Assuming the production of 20%-efficient modules without adding any process compared to the baseline process, this option would produce a manufacturing cost of $2.12/W, which represents 15% reduction in cost. A 20% efficiency module does not produce enough cost reduction. Therefore, the next step is to analyze the effect of an even higher cell efficiency, 24.3%, on cost. This higher efficiency module gives the manufacturing cost of $1.75/W, which represents 30% reduction in cost. However, achieving 24.3% without adding any process compared to the baseline process is highly unlikely. The next step, PARC I, is the result of cost analysis using the proposed device fabrication technologies. Our proposed IBC cells will be able to accept thin Si wafers, 100-150 μm thick. Therefore, the cost of Si material is reduced to 75% of its original value. The cell processing requires boron diffusion, laser ablation, and alignment/registration processes. Therefore, the processing cost is assumed to be increased 20%. As discussed in the previous section, the cost of module assembly is reduced to 70% of its original value because the IBC structure provides a simpler module assembly process. Assuming that the cell/module efficiency is unchanged (17%), the manufacturing cost would be $2.00/W, which represents 20% reduction in cost. In order to achieve 30% cost reduction using the proposed IBC cells, the cell/module efficiency needs to be improved to 19.4% from 17.0%, and this is very realistic for IBC cells. Hence, as demonstrated in Table 1, the present invention facilitates the production of IBC solar cells having a final cost reduced by up to about 20% over conventional "H-pattern" cells (assuming the same efficiency), and having a cost reduction of 30% or more when the higher efficiency of the IBC solar cells is taken into account.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described above with reference to n-type Si substrates, it is possible to start with p-type Si substrate. In this case, the width of boron source would be in the range of about 10 to 500 μm, and more preferably in the range of 200-300 μm, and the spacing would be in the range of 100-3000 μm, and more preferably in the range of 1000-1200 μm. In addition, the present invention is not necessarily limited to the use of boron and phosphorus as dopants (unless specified in the claims), and is intended to extend to any other dopants exhibiting the diffusion barrier characteristics described herein, such as gallium (Ga) and arsenic (As). Moreover, the formation of grooves to separate the p+ and n+ diffusion regions is not necessarily limited to laser ablation, and may be extended to any other suitable method capable of generating the grooves described herein. For example, the grooves can also be made by using selective chemical etching methods through such as printing or extruding an etching paste on the rear surface of the substrate.

The invention claimed is:

1. An interdigitated back contact solar cell comprising
a substrate having a rear surface and an opposing front surface;
a plurality of interdigitated diffusion regions formed in the rear surface of the substrate, the plurality of interdigitated diffusion regions including a first diffusion region and a second diffusion region having a first doping concentration and extending a first depth into the substrate from the rear surface, and a third diffusion region having a second doping concentration and extending a second depth into the substrate from the rear surface, the third diffusion region being disposed between the first and second diffusion regions; and
a plurality of grooves defined between a corresponding pair of side walls that extend from the rear surface into the substrate, each of the plurality of grooves being disposed between an associated adjacent pair of said plurality of interdigitated diffusion regions such that the first diffusion region is separated from the third diffusion region by a first groove, and the second diffusion region is separated from the third diffusion region by a second groove,
wherein each of the plurality of interdigitated diffusion regions extends continuously between an associated adjacent pair of said plurality of grooves such that said third diffusion region extends from a first side wall of said first groove to a second side wall of said second groove, and
wherein each of said plurality of grooves having a third depth into the substrate from the rear surface that is greater than the first and second depths.

2. The interdigitated back contact solar cell according to claim 1, wherein the first and second diffusion regions comprise a p-type dopant, and wherein the third diffusion region comprises an n-type dopant.

3. The interdigitated back contact solar cell according to claim 1, wherein the substrate comprises an n-type substrate.

4. The interdigitated back contact solar cell according to claim 1, wherein the substrate comprises an p-type substrate.

5. The interdigitated back contact solar cell according to claim 1, wherein the depth of each of said plurality of grooves is in the range of 0.2 to 10 μm, and wherein each of said plurality of grooves has a width in the range of 1 to 50 μm.

6. The interdigitated back contact solar cell according to claim 1, wherein the depth of each of said plurality of grooves is in the range of 0.5 to 1.5 μm, and wherein each of said plurality of grooves has a width in the range of 1 to 10 μm.

7. An interdigitated back contact solar cell according to claim 1, further comprising a fourth diffusion region formed in the front surface of the substrate, the fourth diffusion region having the second doping concentration and extending a second depth into the substrate from the rear surface.

8. An interdigitated back contact solar cell according to claim 7, further comprising a passivation layer disposed over the rear surface of the substrate, wherein the passivation layer includes portions respectively disposed in each of said plurality of grooves.

9. An interdigitated back contact solar cell according to claim 8, further comprising a plurality of metal contacts extending through the passivation layer, wherein each said metal contact abuts a corresponding one of said plurality of diffusion regions.

* * * * *